(12) United States Patent
Andreev et al.

(10) Patent No.: US 6,804,811 B2
(45) Date of Patent: Oct. 12, 2004

(54) PROCESS FOR LAYOUT OF MEMORY MATRICES IN INTEGRATED CIRCUITS

(75) Inventors: Alexander E. Andreev, San Jose, CA (US); Ivan Pavisic, San Jose, CA (US); Ranko Scepanovic, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 48 days.

(21) Appl. No.: 10/254,616

(22) Filed: Sep. 25, 2002

(65) Prior Publication Data

US 2004/0060029 A1 Mar. 25, 2004

(51) Int. Cl.⁷ .............................................. G06F 17/50
(52) U.S. Cl. ............................ 716/12; 716/13; 716/14
(58) Field of Search ................................. 716/1, 2, 4, 5, 716/6, 7, 8, 9, 10, 11, 12, 13, 14, 15, 16

(56) References Cited

U.S. PATENT DOCUMENTS

| | | | | |
|---|---|---|---|---|
| 6,230,304 B1 | * | 5/2001 | Groeneveld et al. ........... | 716/7 |
| 6,467,073 B1 | * | 10/2002 | Merchant ...................... | 716/16 |
| 6,505,336 B1 | * | 1/2003 | Andreev et al. .............. | 716/14 |
| 6,536,028 B1 | * | 3/2003 | Katsioulas et al. ........... | 716/17 |
| 2003/0131334 A1 | * | 7/2003 | Suaya et al. ................. | 716/12 |
| 2003/0182649 A1 | * | 9/2003 | Harn .......................... | 716/11 |

* cited by examiner

*Primary Examiner*—Vuthe Siek
*Assistant Examiner*—Binh C. Tat
(74) *Attorney, Agent, or Firm*—Westman, Champlin & Kelly

(57) ABSTRACT

A memory module is formed on an integrated circuit by arranging memory cells in columns, and routing signal wires from module pins at an edge of the module to respective memory cells. The module pins are optimally positioned relative to the memory cells, and routing wires extend from the pins along routing lines to the cells. Buffer channels are defined between memory cells and orthogonal to the columns, and buffers are selectively inserted into the routing wires in the buffer channels by placing a plurality of buffers in each buffer channel. Signal wires to be buffered at a buffer channel are identified, and the signal wires are routed through each buffer channel so that (i) a signal wire to be buffered is re-routed to an input and output of a buffer, and (ii) all other signal wires are routed along their respective routing lines.

22 Claims, 5 Drawing Sheets

PROCESS FOR LAYOUT OF MEMORY MATRICES IN INTEGRATED CIRCUITS

FIELD OF THE INVENTION

This invention relates to placement of memory matrices in integrated circuits, and particularly to wire routing and buffer placement for memory matrices in integrated circuits.

BACKGROUND OF THE INVENTION

An integrated circuit chip (herein referred to as an "IC" or "chip") comprises cells and connections between cells supported by a substrate. A cell is a group of one or more circuit elements, such as transistors, capacitors, memories and other basic circuit elements, grouped to perform a function. Each cell may have one or more pins, which in turn may be connected to one or more pins of other cells by wires. A net comprises circuitry coupling an input pin to one or more output pins. A typical IC includes a large number of cells and requires complex wire connections between the cells. A typical chip has thousands, tens of thousands and even hundreds of thousands of pins which are connected in various combinations.

ICs include multiple layers of metal, semiconductor and insulator material, each configured so that it cooperates with other layers to define circuit elements, such as buffers, memory devices, gates and routing wires. The metal layers define routing wires for connecting together various elements, including memory matrices. Usually certain metal layers, such as even-numbered metal layers, are dedicated to horizontal routing wires, and other metal layers, such as odd-numbered metal layers, are dedicated to vertical routing wires. At least one insulator layer between adjacent metal layers insulates the metal layers from each other, and metal posts or channels between horizontal and vertical routing wires provide connection between them so signals and power can propagate through the IC.

One problem in designing ICs with memory matrices is that the memory usually must be a "standard" size, fitting standard parameters. Consequently, it has not been practical to employ a large number of memory matrices on ICs, nor to fabricate ICs with large non-standard memories.

SUMMARY OF THE INVENTION

The present invention is directed to a technique for placement of plural memory cells, including any necessary buffers, on ICs. The technique is useful in ICs with large percentages of memories to design compact layouts of groups of heterogeneous memories, as well as to ICs that require large memories with a non-standard parameters using smaller standard memory elements.

The invention includes pin placement, signal routing, power routing and repeater buffer insertion, to complete a memory module layout.

In accordance with an embodiment of the invention, a memory module is formed on an integrated circuit from a plurality of memory cells. The memory cells are arranged in columns, and signal wires are routed from module pins at an edge of the module to respective memory cells. Buffer channels are defined between memory cells and orthogonal to the columns, and buffers are selectively inserted into the routing wires in the buffer channels.

In preferred embodiments, the signal wires are routed by positioning module pins along the edge of the module at optimal coordinates to the respective memory cells. First signal wires are routed along respective routing lines from the respective module pins to positions adjacent respective farthest memory cells to be coupled to the module pin. Second signal wires are routed in local routing regions for each memory cell from the respective memory cell to the respective first signal wire.

The buffers are selectively inserted by placing a plurality of buffers in each buffer channel. Signal wires to be buffered at a buffer channel are identified, and the signal wires are routed through each buffer channel so that (i) a signal wire to be buffered is re-routed to an input and output of a buffer, and (ii) all other signal wires are routed along their respective routing lines.

In some embodiments, power wires are routed ween columns and between memory cells and are coupled to the memory cells and buffers.

DETAILED DESCRIPTION OF THE PREFERRED EMBODIMENTS

Figure 1:
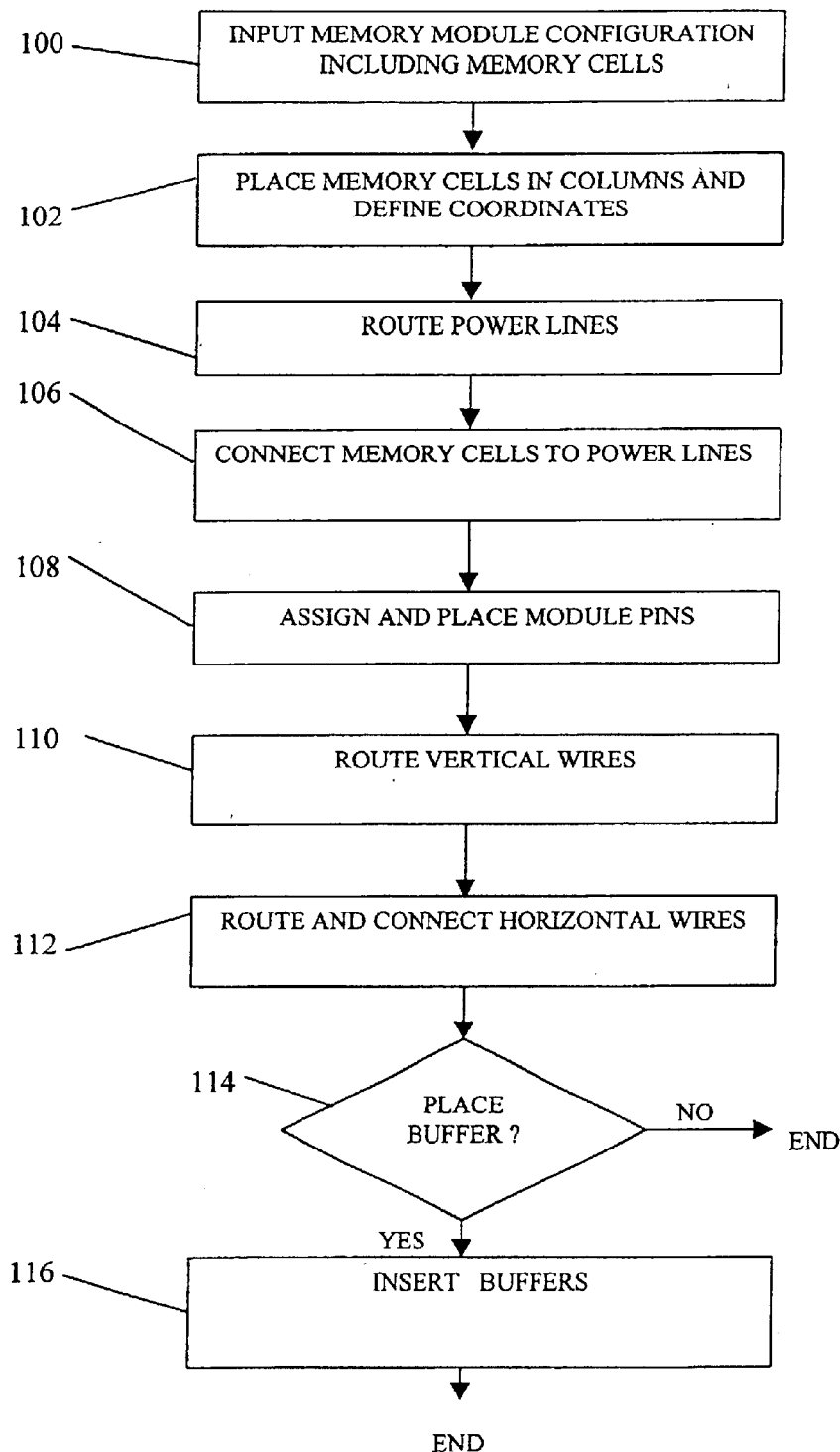
FIG. 1 is a flowchart of a process of laying out memory matrices in accordance with an embodiment of the present invention.
Figure 2:
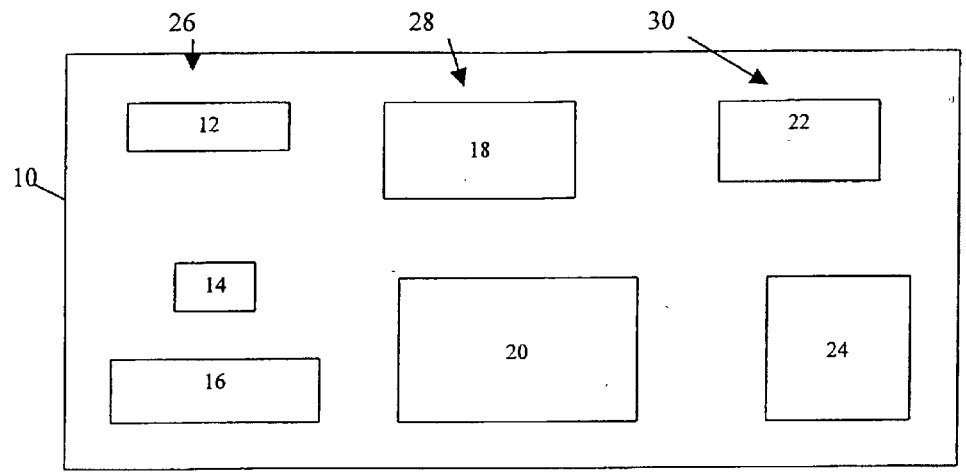
FIGS. 2–8 illustrate application of the process to laying out a memory matrix in an IC.

FIG. 1 is a flowchart illustrating a process according to one embodiment of the invention. The process is preferably carried out in a computer processor using a computer program containing program code that enables the processor to perform the steps of the process. The process commences at step 100 with the input of a definition of a module consisting of memory macro cells, such as module 10 containing cells 12, 14, 16, 18, 20, 22 and 24 arranged in non-overlapping columns 26, 28 and 30, shown in FIG. 2. At step 102, the memory cells in each column are ordered in the vertical direction and assigned approximate vertical coordinates so that adjacent memories do not overlap. The memory cells 12–24 are arranged so that cells within a column can share signals, but only within a column 26, 28 or 30. The memory cells are positioned so that signal pins are along the top and/or bottom of the module.

Figure 3:
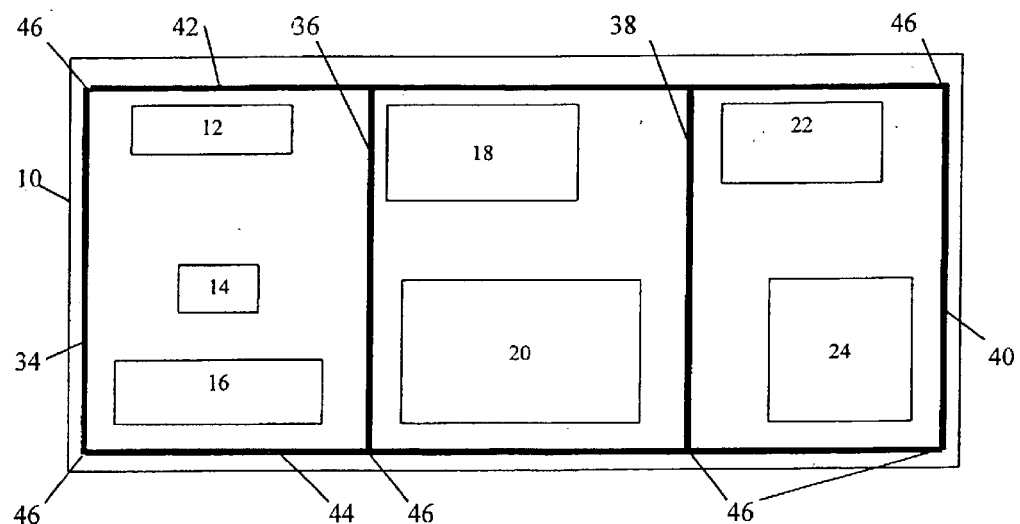
Figure 4:
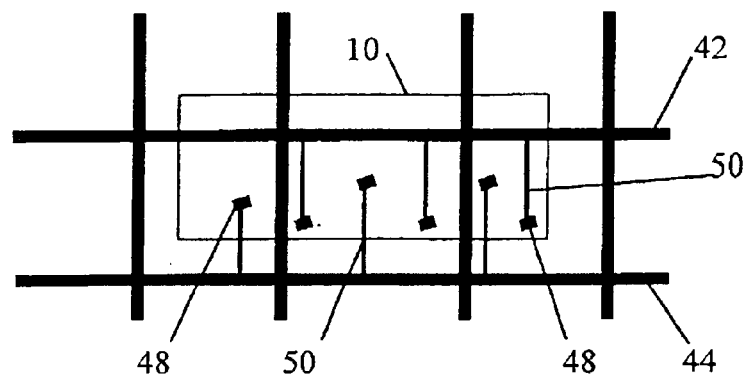

At step 104 a power ring 32 is created, comprising vertical power wires 34, 36, 38 and 40 and horizontal power wires 42 and 44, shown in FIG. 3. For example, vertical wires 34, 36, 38 and 40 may be routed on the fifth metal layer of the IC, and horizontal wires may be on the fourth metal layer. The horizontal and vertical power wires are coupled together at power posts or columns 46. At step 106, each memory 10 is connected to this structure. Memory power routing depends on the type of the memory and its power pin distribution. A typical situation is illustrated in FIG. 4 where the memory power pins 48 are coupled by vertical wires 50 to horizontal wires 42 or 44 of the power ring structure. Typically, the memory module 10 is also coupled to a ground plane (not shown) through other power pins to complete the power connection.

At step 108, module pins are assigned and placed along the bottom (and/or top) of memory module 10. Since no signal sharing is permitted between memory cells in different columns, pin assignment process is carried out on each column separately. The ideal location for a column pin is defined as the average horizontal coordinate of all memory cell pins connected to the column pin. For example, if three memory cell pins having respective horizontal coordinates of x=1.3, 1.5and 1.6are to be connected to a given column pin for the module, the ideal horizontal coordinate for the column pin will be x=1.5. To resolve pin position conflict, such as if two or more pins have the same ideal horizontal (x) coordinate, each pin is assigned a coordinate such that:

no two pins are assigned the same coordinate, the distance between ideal and assigned pin coordinate is minimized, and no pin coordinate intersects a power line.

One useful technique for assigning pin coordinates is described in U.S. Pat. No. 6,453,453 granted Sep. 17, 2002 for "Process for Solving Assignment Problems in Integrated Circuit Designs with Unimodal Object Penalty Functions and Linearly Ordered Set of Boxes" by Andreev et al., and assigned to the same assignee as the present invention, the disclosure of which is herein incorporated by reference.

Next, each column pin is connected to one or more memory pins in that column. Routing consists of two parts. At step 110, a vertical routing wire, such on the fifth metal layer, is extended along respective routing lines that extend from the respective column pin to the last or farthest memory cell of the column that needs to be connected to the pin. For example, if the column pin is at the bottom of the module, the vertical routing wire extends upward to the highest memory cell in the column requiring connection to that column pin.

At step 112, a horizontal pin channel is defined adjacent each memory cell to connect memory input/output pins to the respective vertical wire from the column pin. The pin channel is routed on three layers, such as metal layers 1, 2 and 3, using a simple greedy procedure. In this step, the memory cell pins are processed one by one, with each pin being assigned a horizontal wire on the first available grid line from the top of the pin channel, taking into account wires that have already been placed, as well as applicable design rules related to adjacent via placement. The horizontal wire is coupled to the vertical routing wire established at step 110 using a metal post, and a vertical wire is established, such as on metal layer 2, to couple the horizontal wire to the memory cell pin.

Figure 5:
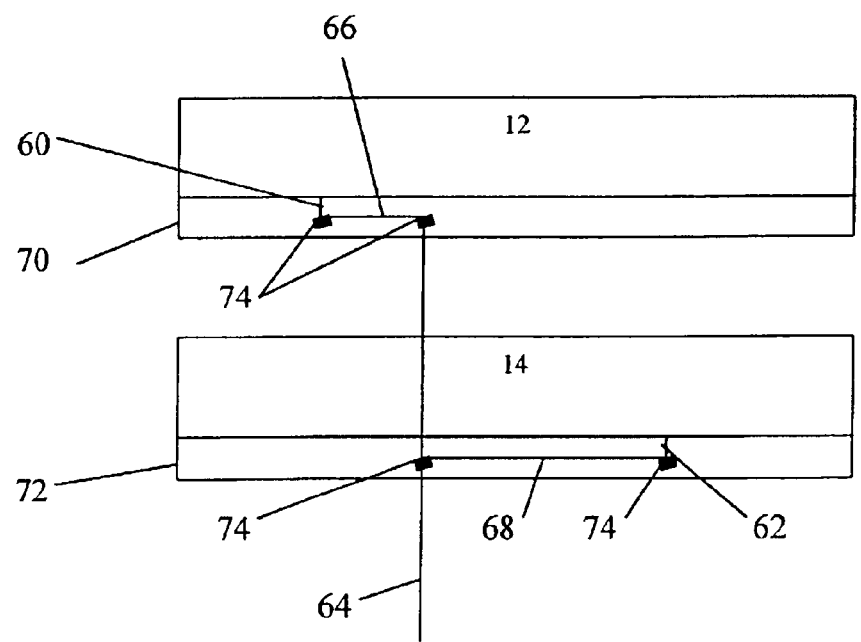

An example of a net routing performed through steps 110 and 112 is illustrated in FIG. 5. In FIG. 5, each memory cell 12 and 14 has respective a vertical signal line 60 and 62, such as on the first or third metal layer of the IC. A vertical routing wire 64 is routed from the module pins through the IC core, such as on the fifth metal layer of the IC, in the manner described in connection with step 110. Horizontal routing wires 66 and 68 are routed along local routing or pin channels 70 and 72, such as in the second metal layer of the IC, and the conductive posts or channels are formed at points 74 between horizontal wire 66 and lines 60 and 64 and between horizontal wire 68 and lines 60 and 64.

Figure 6:
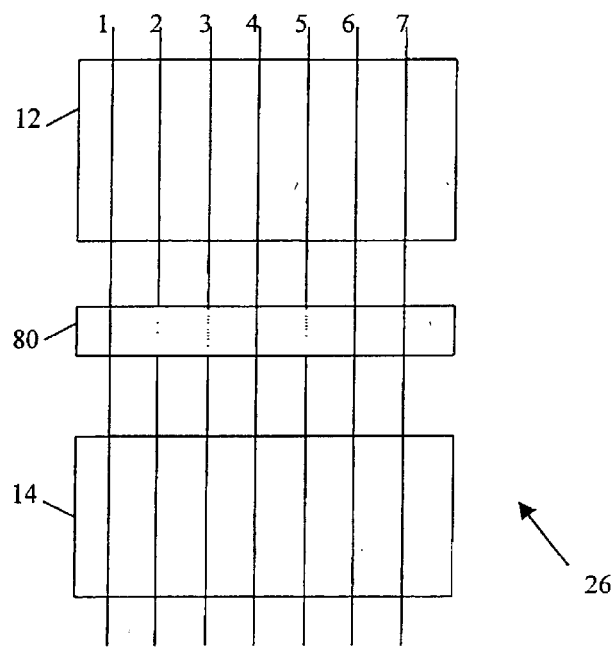
Figure 7:
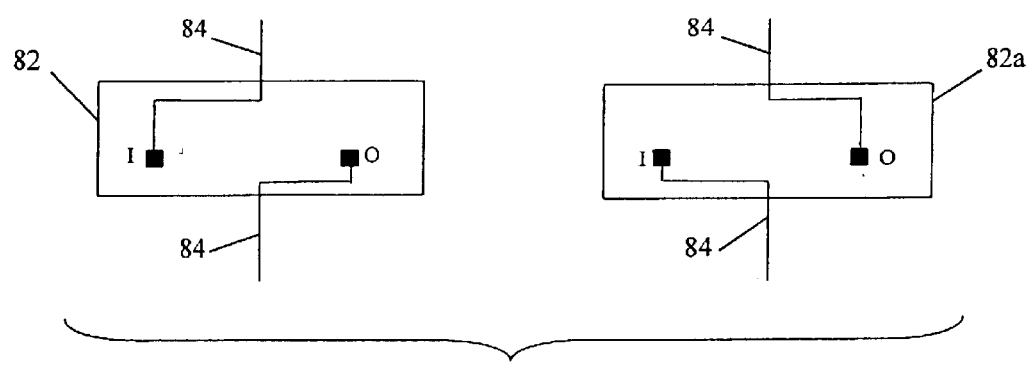

Next, the repeater buffers are inserted into the memory matrix. Repeater buffers, such as buffers 82 or 82 a illustrated in FIG. 7, are placed in horizontal channels between memories cells, and are used to break long vertical wires from column pins. At step 114, wherever a vertical wire crosses a channel between two memory cells, a decision is made whether or not to insert a buffer. The decision is based on design rules, primarily based on the position of the previous buffer on the vertical wire and the maximum distance that a buffer can drive. The vertical wire is considered from the module pin toward the highest memory cell on the vertical wire. Thus, all vertical wires crossing a buffer channel can be considered in two groups: those that need to be buffered and those that pass through the buffer channel without buffering. At step 116, vertical wires that require buffering are broken at the buffer channel and diverted to other metal layers. Buffers 82 and 82a are inserted and coupled to the broken vertical wires to buffer signals on those wires. Wires that do not need to be buffered continue through the buffer channel along their original routing lines. Thus, FIG. 6 illustrates wires 1–7 passing through buffer channel 80 between two memory cells 12 and 14 in a channel 26 (see FIG. 2). Wires 2, 3 and 5 are broken, as shown in dotted lines in FIG. 6, for connection to a buffer in the buffer channel, and wires 1, 4, 6 and 7 pass through the buffer channel.

FIG. 7 illustrates buffers 82 and 82a of the same design, buffer 82 buffers signals from the memory cells and buffer 82a buffers signals to the memory cells. Each buffer 82,82a is locally routed to vertically align the wires 84 coupled to the input and output pins. In the example where the module pins are at the bottom of the module, the vertical wire 84 at the bottom of the buffer will be coupled to the output pin of buffer 82 or the input pin of buffer 82a.

Figure 8:
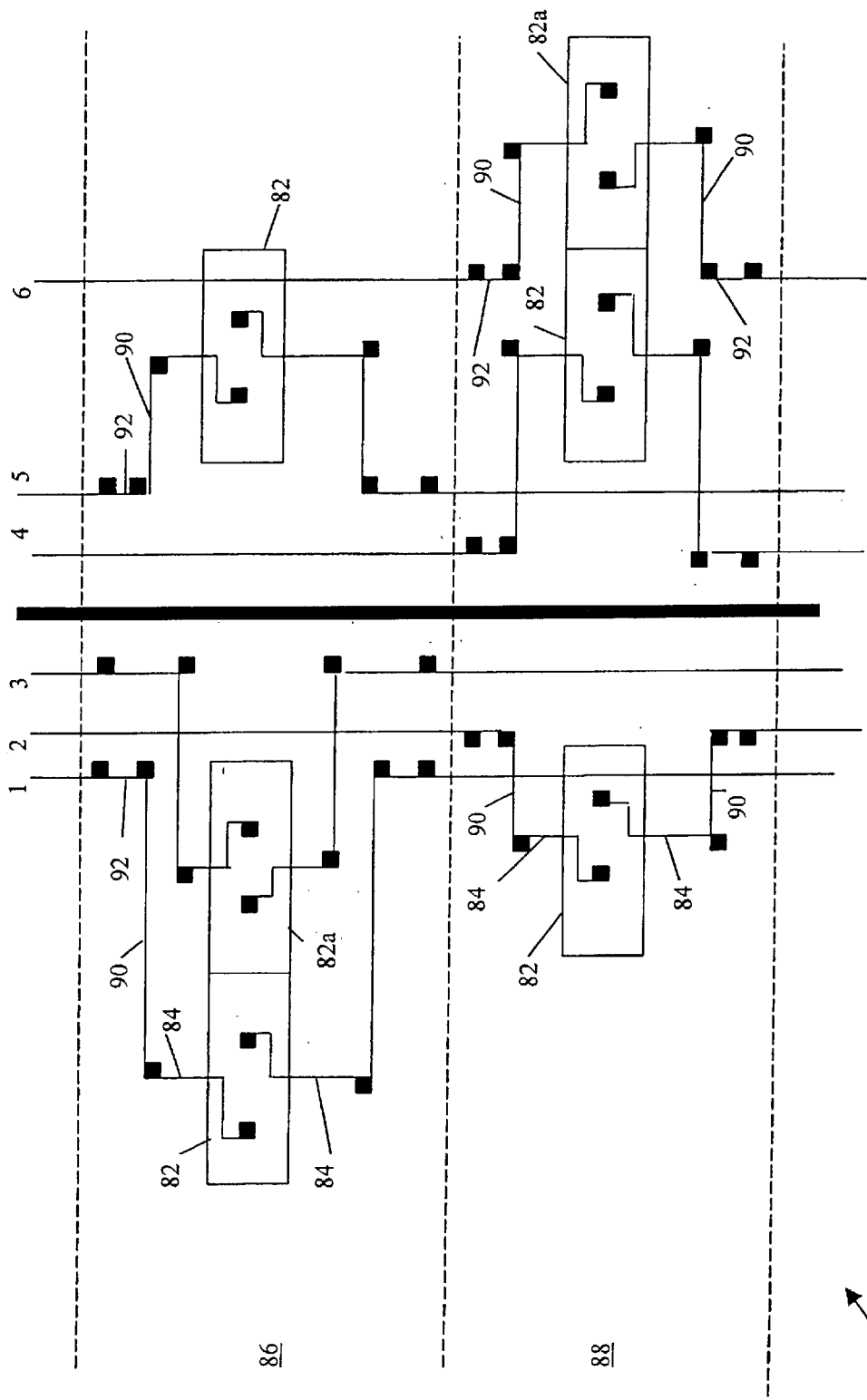

As shown in FIG. 8, buffer channel 80 contains horizontal rows 86 and 88 for buffers 82, 82a. The number of rows required for a buffer channel is determined upon the number of wires that need to be buffered and the buffer size. Typically, the number of rows is between 1 and 3. Vertical wires are first assigned to buffer rows uniformly. Following that, all wires assigned to one row are assigned to specific buffers from that row. The process described in the aforementioned Andreev et al. application is appropriate for this wire assignment. The vertical wires are connected to their respective buffers using the same greedy method used to route pin channels described earlier.

FIG. 8 illustrates an example of a buffer channel routing with two rows of buffers. Wires 1, 3, and 5 are assigned to the first row 86 and wires 2, 4, and 6 are assigned to the second row 88. In row 86, wires 1, 3, and 5 are connected to their corresponding buffers 82 and 82a using the first and third metal routing layers for horizontal routing wires 90 and the second metal routing layer for vertical routing wires 92. Wires 2, 4, and 6 pass through row 86 on the fifth metal layer. Similarly, in row 88, wires 2, 4, and 6 are connected to their corresponding buffers 82 and 82a using the first and third metal routing layers for horizontal routing wires 90 and the second metal routing layer for vertical routing wires 92. Wires 1, 3, and 5 pass through row 88 on the fifth metal layer. Due to the symmetry of the buffers, connections on the two sides of the buffer are symmetrical. A vertical power rail is shown through each buffer channel 94 is illustrated in FIG. 8 for connection to buffers 82 and 82a using a standard approach.

Although the present invention has been described with reference to preferred embodiments, workers skilled in the art will recognize that changes may be made in form and detail without departing from the spirit and scope of the invention.

What is claimed is:

1. A process of laying out a plurality of memory cells to form a memory module on an integrated circuit comprising steps of:

a) arranging a plurality of memory cells in columns;
   b) defining buffer channels between memory cells and orthogonal to the columns;
   c) routing signal wires in the columns through buffer channels from module pins at an edge of the module to respective memory cells; and
   d) selectively inserting buffers into the signal wires in the buffer channels.

2. The process of claim 1, wherein step (c) comprises steps of:

c1) positioning module pins along the edge of the module at optimal coordinates to the respective memory cells;

c2) routing first signal wires along respective routing lines from the respective module pins to positions adjacent a respective farthest memory cell to be coupled to the module pin; and c3) routing second signal wires from respective memory cells to each respective first signal wire.

3. The process of claim 2, wherein step (c2) comprises steps of:

c2A) defining local routing regions for each memory cell; and c2B) routing the second signal wires in the local routing regions.

4. The process of claim 3, further including steps of:

e) routing power wires between columns and between memory cells; and f) coupling the memory cells and buffers to the power wires.

5. The process of claim 4, wherein step (d) comprises steps of:

d1) placing a plurality of buffers in each buffer channel;

d2) identifying a signal wire to be buffered at a buffer channel; and d3) routing signal wires through each buffer channel so that (i) a signal wire to be buffered is re-routed to an input and output of a buffer, and (ii) all other signal wires are routed along their respective routing lines.

6. The process of claim 3, wherein step (d) comprises steps of:

d1) placing a plurality of buffers in each buffer channel;

d2) identifying a signal wire to be buffered at a buffer channel; and d3) routing signal wires through each buffer channel so that (i) a signal wire to be buffered is re-routed to an input and output of a buffer, and (ii) all other signal wires are routed along their respective routing lines.

7. The process of claim 2, wherein step (d) comprises steps of:

d1) placing a plurality of buffers in each buffer channel;

d2) identifying a signal wire to be buffered at a buffer channel; and d3) routing signal wires through each buffer channel so that (i) a signal wire to be buffered is re-routed to an input and output of a buffer, and (ii) all other signal wires are routed along their respective routing lines.

8. The process of claim 2, further including steps of:

e) routing power wires between columns and between memory cells; and f) coupling the memory cells and buffers to the power wires.

9. The process of claim 1, further including steps of:

e) routing power wires between columns and between memory cells; and f) coupling the memory cells and buffers to the power wires.

10. The process of claim 1, wherein the signal wires are routed predominately along respective routing lines and step (d) comprises steps of:

d1) placing a plurality of buffers in each buffer channel;

d2) identifying a signal wire to be buffered at a buffer channel; and d3) routing signal wires through each buffer channel so that (i) each signal wire to be buffered is re-routed to an input and output of a respective buffer, and (ii) all other signal wires are routed along their respective routing lines.

11. The process of claim 1, wherein the integrated circuit has a plurality of metal layers and the step of routing signal wires comprises routing at least some of the signal wires across at least some of the memory cells on metal layers different from metal layers coupled to the respective memory cells.

12. A computer-readable medium storing program code to cause a processor to perform computer-executable process steps for laying out a plurality of memory cells to form a memory module on an integrated circuit, said process steps comprising steps to:

a) arrange a plurality of memory cells in columns;

b) define buffer channels between memory cells and orthogonal to the columns;

c) route signal wires in the columns through buffer channels from module pins at an edge of the module to respective memory cells; and d) selectively insert buffers into the signal wires in the buffer channels.

13. The computer-readable medium of claim 12, wherein the program code further causes the processor to perform step c) to:

c1) position module pins along the edge of the module at optimal coordinates to the respective memory cells;

c2) route first signal wires along respective routing lines from the respective module pins to positions adjacent a respective farthest memory cell to be coupled to the module pin; and c3) route second signal wires from the respective memory cells to each respective first signal wire.

14. The computer-readable medium of claim 13, wherein the program code further causes the processor to perform step c2) to:

c2A) define local routing regions for each memory cell; and c2B) route the second signal wires in the local routing regions.

15. The computer-readable medium of claim 14, wherein the program code further causes the processor to:

e) route power wires between columns and between memory cells; and f) couple the memory cells and buffers to the power wires.

16. The computer-readable medium of claim 15, wherein the program code further causes the processor to perform step d) to:

d1) place a plurality of buffers in each buffer channel;

d2) identify a signal wire to be buffered at a buffer channel; and d3) route signal wires through each buffer channel so that (i) a signal wire to be buffered is re-routed to an input and output of a buffer, and (ii) all other signal wires are routed along their respective routing lines.

17. The computer-readable medium of claim 14, wherein the program code further causes the processor to perform step d) to:

d1) place a plurality of buffers in each buffer channel;

d2) identify a signal wire to be buffered at a buffer channel; and d3) route signal wires through each buffer channel so that (i) a signal wire to be buffered is re-routed to an input and output of a buffer, and (ii) all other signal wires are routed along their respective routing lines.

18. The computer-readable medium of claim 13, wherein the program code further causes the processor to perform step d) to:
   d1) place a plurality of buffers in each buffer channel;
   d2) identify a signal wire to be buffered at a buffer channel; and
   d3) route signal wires through each buffer channel so that (i) a signal wire to be buffered is re-routed to an input and output of a buffer, and (ii) all other signal wires are routed along their respective routing lines.

19. The computer-readable medium of claim 13, wherein the program code further causes the processor to:
   e) route power wires between columns and between memory cells; and
   f) couple the memory cells and buffers to the power wires.

20. The computer-readable medium of claim 12, wherein the program code further causes the processor to:
   e) route power wires between columns and between memory cells; and
   f) couple the memory cells and buffers to the power wires.

21. The computer-readable medium of claim 12, wherein the signal wires are routed predominately along respective routing lines and the program code further causes the processor to perform step d) to:
   d1) place a plurality of buffers in each buffer channel;
   d2) identify a signal wire to be buffered at a buffer channel; and
   d3) route signal wires through each buffer channel so that (i) a signal wire to be buffered is re-routed to an input and output of a respective buffer, and (ii) all other signal wires are routed along their respective routing lines.

22. The computer-readable medium of claim 12, wherein the integrated circuit has a plurality of metal layers and the step of routing signal wires comprises routing at least some of the signal wires across at least some of the memory cells on metal layers different from metal layers coupled to the respective memory cells.

* * * * *